(12) United States Patent
Gaska et al.

(10) Patent No.: US 6,903,385 B2
(45) Date of Patent: Jun. 7, 2005

(54) SEMICONDUCTOR STRUCTURE HAVING A TEXTURED NITRIDE-BASED LAYER

(75) Inventors: Remigijus Gaska, Columbia, SC (US); Xuhong Hu, Lexington, SC (US); Michael Shur, Latham, NY (US)

(73) Assignee: Sensor Electronic Technology, Inc., Latham, NY (US)

( * ) Notice: Subject to any disclaimer, the term of this patent is extended or adjusted under 35 U.S.C. 154(b) by 0 days.

(21) Appl. No.: 10/676,963

(22) Filed: Oct. 1, 2003

(65) Prior Publication Data

US 2004/0070003 A1 Apr. 15, 2004

Related U.S. Application Data

(60) Provisional application No. 60/417,224, filed on Oct. 9, 2002.

(51) Int. Cl.$^7$ .............................................. H01L 31/072
(52) U.S. Cl. ........................ 257/192; 257/94; 257/103; 257/190; 257/194
(58) Field of Search .......................... 257/192, 94, 103, 257/190, 194

(56) References Cited

U.S. PATENT DOCUMENTS 5,562,769 A * 10/1996 Dreifus et al. ................. 117/86
5,597,745 A * 1/1997 Byun et al. .................. 438/239

FOREIGN PATENT DOCUMENTS

| JP | 2001168386 A | * | 6/2001 |
| JP | 2001168387 A | * | 6/2001 |

OTHER PUBLICATIONS

"Insulating Gate III–N Heterostructure Field–Effect Transistors for High–Power Microwave and Switching Applications," M. A. Khan et al., IEEE Transactions on Microwave Theory and Techniques, vol. 51, No. 2, Feb. 2003, pp. 624–633.

"Surface Acoustic Wave Propagation Characteristics of Aluminum Nitride Thin Films Grown on Polycrystalline Diamond," G. F. Iriarte, Journal of Applied Physics, vol. 93, No. 12, Jun. 15, 2003, pp. 9604–9609.

"Temperature Effect on the Quality of AlN Thin Films," M. P. Thompson et al., MRS Internet J. Nitride Semicond. Res. 4S1, G3.7 (1999).

"High Rate and Selective Etching of GaN, AlaN, and AlN Using an Inductively Coupled Plasma,"S. A. Smith et al., Applied Physics Letters, vol. 71, No. 25, Dec. 22, 1997, pp. 3631–3633.

"Reactive Sputter Deposition of Highly Oriented AlN Films at Room Temperature," G.F. Iriarte et al., J. Mater. Res., vol. 17, No. 6, Jun. 2002, pp. 1469–1475.

"PVT Growth of Bulk AlN Crystals With Low Oxygen Contamination," M. Bickermann et al., Phys. Stat. Sol. (a), vol. 195, No. 1, 3–10 (2003), pp. 1–4.

"Introduction to Solid–State Lighting," Zukauskas et al., pp. 61–69. (2002).

\* cited by examiner

*Primary Examiner*—Nathan J. Flynn
*Assistant Examiner*—Remmon R. Fordé
(74) *Attorney, Agent, or Firm*—John W. LaBatt; Hoffman, Warnick, & D'Alessandro LLC

(57) ABSTRACT

A semiconductor structure having a textured nitride-based layer. The textured nitride-based layer can be formed above one or more crystalline nitride layers and a substrate, and can be formed into any desired pattern. The semiconductor structure can be incorporated as part of, for example, a field effect transistor, a light emitting diode, or a laser.

19 Claims, 7 Drawing Sheets

SEMICONDUCTOR STRUCTURE HAVING A TEXTURED NITRIDE-BASED LAYER

REFERENCE TO PRIOR APPLICATION

The current application claims the benefit of co-pending U.S. Provisional Application No. 60/417,224, filed on Oct. 9, 2002, which is hereby incorporated herein by reference.

BACKGROUND OF THE INVENTION

1. Technical Field

The invention relates generally to nitride-based semiconductor structures, and more specifically, to a semiconductor structure that includes a textured nitride-based layer.

2. Related Art

Selective etching of nitride-based layers such as Aluminum Nitride (AlN) and Gallium Nitride (GaN) can be used in fabricating semiconductor devices. This etching relies on the difference between the respective etching rates for GaN and AlN. However, this approach does not allow for the selective etching of AlN layers that are widely used in nitride-based devices. Textured AlN layers and highly textured AlN boules can be produced by sputtering, Molecular Beam Epitaxy (MBE), or the like. Textured and epitaxial thin AlN layers have an etching rate that can be approximately two orders of magnitude higher than crystalline materials, making their manufacture more efficient. As a result, textured AlN layers have been applied to many solutions in electronic, electro-acoustic, and optoelectronic devices. However, to date, selective etching of a textured and/or epitaxial layer comprising, for example, AlN, GaN, InN, AlGaN, InGaN, or AlGaInN, deposited on an epitaxial layer comprising, for example, AlN, GaN, InN, AlGaN, InGaN, or AlGaInN, has not been used in the manufacture of semiconductor structures.

As a result, a need exists for a semiconductor structure that comprises a textured nitride-based layer formed above an epitaxially grown nitride-based layer.

SUMMARY OF THE INVENTION

The invention provides a semiconductor structure having a textured nitride-based layer formed above an epitaxially grown nitride-based layer. Specifically, under the present invention, a textured nitride-based layer is formed above an epitaxial layer (crystalline or amorphous) and a substrate in a semiconductor structure. In one embodiment, the textured nitride-based layer (such as textured AlN) is formed on a crystalline nitride layer. Various other layers and/or components can be included depending on the application for which the semiconductor structure will be used. The semiconductor structure can be used to form, for example, a field effect transistor or a light emitting device (e.g., light emitting diode, laser, etc.). Inclusion of the textured nitride-based layer can be used for designs that increase a lifetime and/or a reliability of the device, decrease a noise produced by the device, and/or make the device easier to manufacture.

A first aspect of the invention provides a semiconductor structure, comprising: a substrate; a first layer formed above the substrate; and a textured nitride layer formed on the first layer.

A second aspect of the invention provides a field effect transistor comprising: a substrate; an active layer formed above the substrate; a crystalline nitride layer formed above the active layer; and a textured nitride layer formed on the crystalline nitride layer.

A third aspect of the invention provides a light emitting device, comprising: a substrate; an n-type layer formed above the substrate; a light emitting structure formed above the n-type layer; a p-type crystalline nitride layer formed above the light emitting structure; and a textured nitride layer formed on the crystalline nitride layer.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood that for the purposes of the present invention, Al means Aluminum, In means Indium, Ga means Gallium, and N means Nitrogen.

As indicated above, the invention provides a semiconductor structure having a textured nitride-based layer formed above an epitaxially grown nitride-based layer. Specifically, under the present invention, a textured nitride-based layer is formed above an epitaxial layer (crystalline or amorphous) and a substrate in a semiconductor structure. In one embodiment, the textured nitride-based layer (such as textured AlN) is formed on a crystalline nitride layer. Various other layers and/or components can be included depending on the application for which the semiconductor structure will be used. The semiconductor structure can be used to form, for example, a field effect transistor or a light emitting device (e.g., light emitting diode, laser, etc.). Inclusion of the textured nitride-based layer can be used for designs that increase a lifetime and/or a reliability of the device, decrease a noise produced by the device, and/or make the device easier to manufacture.

Figure 1:
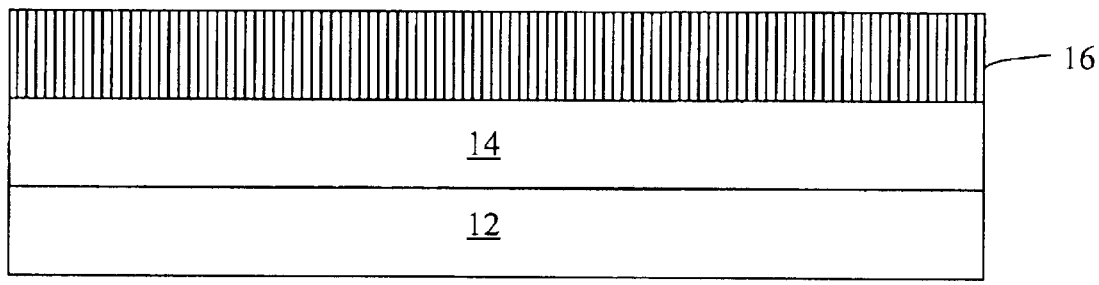
FIG. 1 shows an illustrative semiconductor structure according to one embodiment of the invention.

Turning to the drawings, FIG. 1 shows an illustrative semiconductor structure 10 according to one embodiment of the invention. Semiconductor structure 10 is shown including a substrate 12, a first layer 14 formed over substrate 12, and a textured nitride layer 16 formed over first layer 14. Substrate 12 can comprise any material known in the art including, for example, sapphire, silicon carbide, aluminum nitride, gallium nitride, zinc oxide, lithium gallate, lithium niobate, diamond, silicon, or the like. First layer 14 can comprise, for example, a crystalline or epitaxial nitride layer. To this extent, first layer 14 and/or textured nitride layer 16 can comprise, for example, AlN, GaN, InN, AlGaN, InGaN, AlGaInN, or the like. It is understood that throughout the drawings, each layer shown can be deposited directly on the lower layer or one or more additional layers can be formed between the two layers. For example, a buffer layer can be included between substrate 12 and first layer 14.

Semiconductor structure 10 can be configured to operate as any type of semiconductor device, including for example, a power switching device, a microwave device, an optoelectronic device, and an acousto-optic device. Examples of these devices include a photodetector, a field effect transistor, a gated bipolar junction transistor, a gate hot electron transistor, a gated heterostructure bipolar junction transistor, a gas sensor, a liquid sensor, a pressure sensor, a multi-function sensor of both pressure and temperature, a light emitting diode, a laser, and the like. To this extent, semiconductor structure 10 can include one or more additional layers/structures formed between substrate 12 and first layer 14, between first layer 14 and textured nitride layer 16, and/or above textured nitride layer 16. Further, each layer can be formed over all or only a portion of a lower layer, can vary in thickness, and can be formed into any pattern that provides the desired functionality for the semiconductor device. Each layer can be deposited and/or patterned using any solution now known or later developed. For example, textured nitride layer 16 can be formed using MBE and/or patterned using selective etching to remove a portion of textured nitride layer 16.

Figure 2:
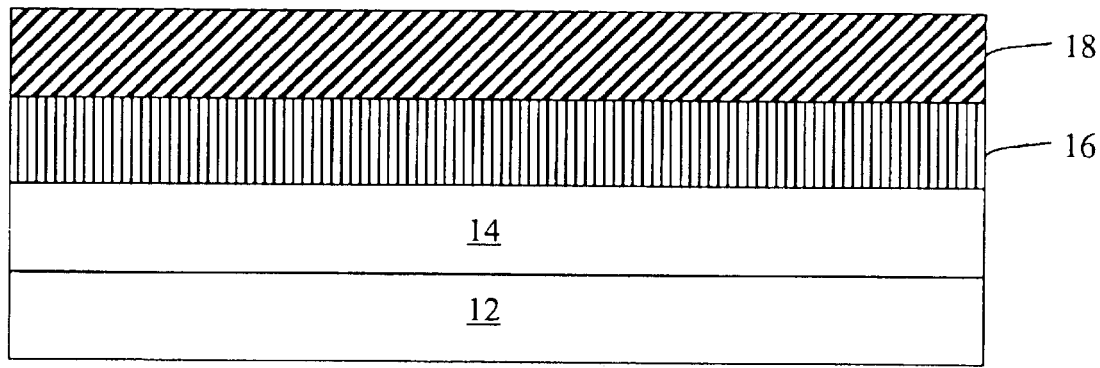
FIG. 2 shows an illustrative semiconductor structure according to another embodiment of the invention.

As noted, semiconductor structure 10 can include one or more additional layers. For example, FIG. 2 shows semiconductor structure 10 having a second layer 18 formed above textured nitride layer 16. In one embodiment, second layer 18 can comprise a dielectric layer or a composite dielectric layer comprising silicon dioxide, silicon nitride, or the like. In this case, second layer 18 can passivate one or more layers formed below second layer 18, e.g., textured nitride layer 16. In an alternative embodiment, second layer 18 can comprise a metal layer. In this embodiment, the metal layer can serve as a gate of a field effect transistor, such as a Heterostructure Field Effect Transistor (HFET) or a Metal Oxide Heterostructure Field Effect Transistor (MOSHFET).

Figure 3:
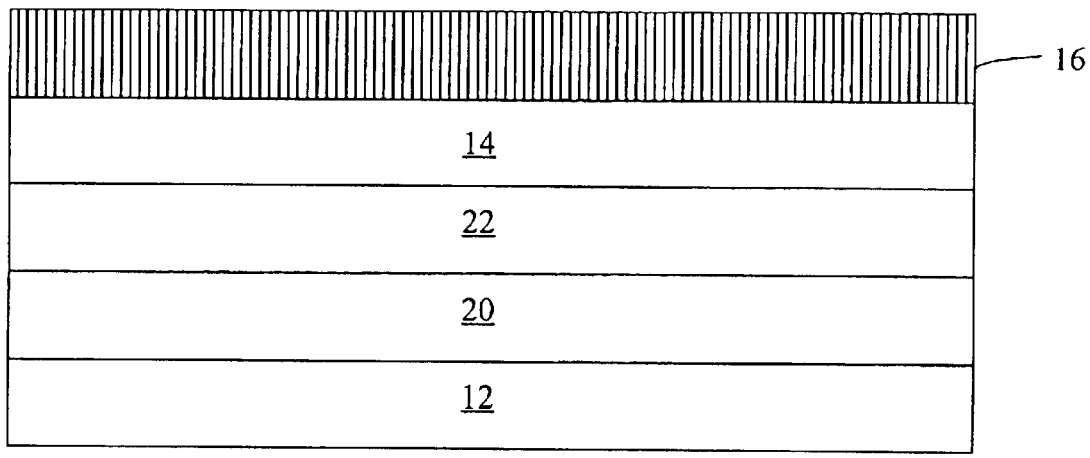
FIG. 3 shows an illustrative semiconductor structure according to still another embodiment of the invention.

Additionally, semiconductor structure 10 can include one or more layers formed between substrate 12 and first layer 14 and/or between first layer 14 and textured nitride layer 16. For example, FIG. 3 shows semiconductor structure 10 having a buffer layer 20 and a third layer 22 formed between substrate 12 and first layer 14. Buffer layer 20 and third layer 22 can each comprise, for example, any combination of AlN, GaN, AlGaN, AlGaInN, or the like, and third layer 22 could have a graded composition. Buffer layer 20 provides a buffer between substrate 12 and third layer 22. It is understood that buffer layer 20 could be included without third layer 22. In this case, buffer layer 20 would provide a buffer between substrate 12 and first layer 14. Third layer 22 can comprise an active layer or the like that provides functionality for semiconductor structure 10. Third layer 22 can provide improved localization of carriers in the channel, and can be included as part of a device such as a Double Heterostructure Field Effect Transistor.

Figure 4:
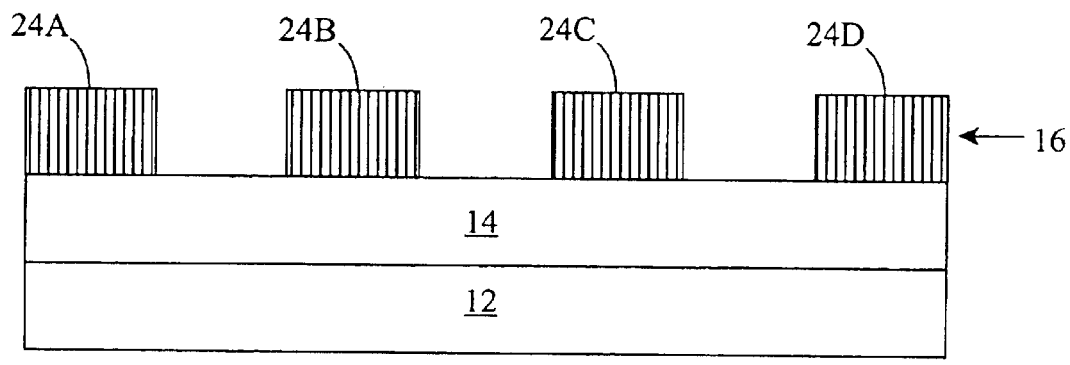
FIG. 4 shows an illustrative semiconductor structure having a patterned textured nitride layer according to one embodiment of the invention.
Figure 5:
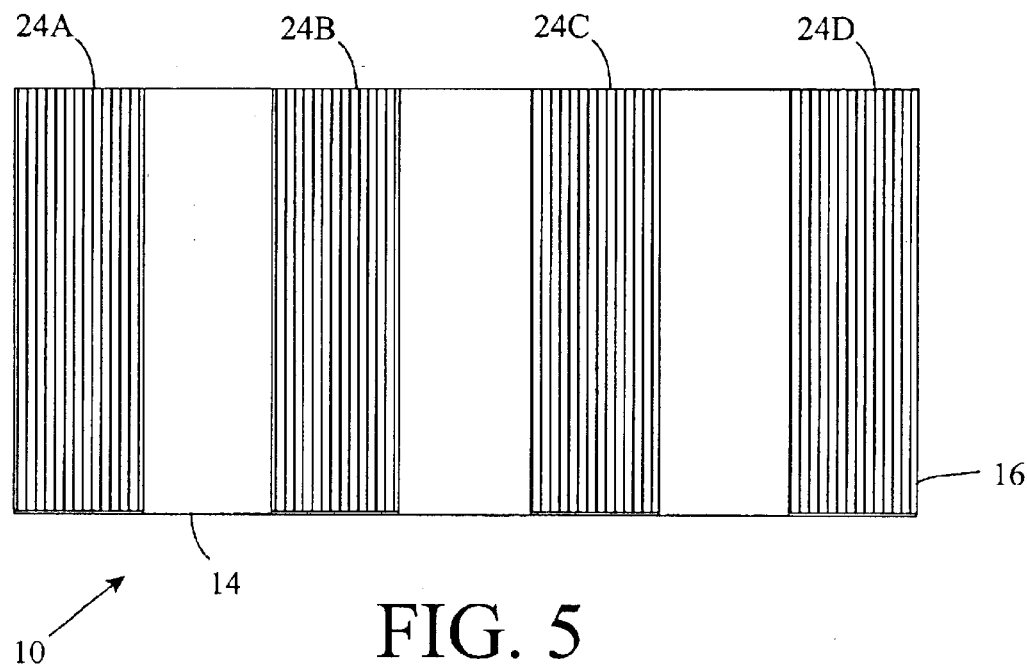
FIG. 5 shows a top view of the structure in FIG. 4.
Figure 6:
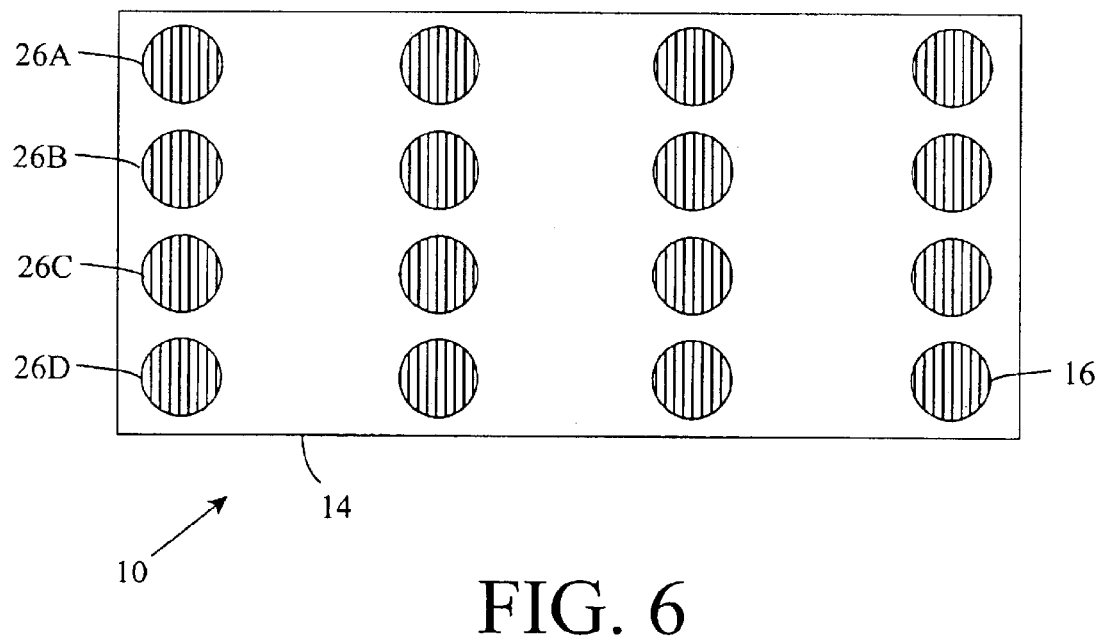
FIG. 6 shows an illustrative semiconductor structure having a patterned textured nitride layer according to another embodiment of the invention.

As noted previously, one or more layers of semiconductor structure 10 could be formed into a pattern. The pattern could be used to form a photonic crystal, incorporated as part of a mechanical electronic monolithic structure, form a passive element for a monolithic microwave integrated circuit (e.g., resistor, capacitor, inductor, transmission line, interconnect, etc.), or the like. For example, FIG. 4 shows a side view and FIG. 5 shows a top view of semiconductor structure 10 in which textured nitride layer 16 has been formed into a stripe pattern that comprises a set of stripes 24A–D. Set of stripes 24A–D can be formed in the construction of a striped light emitting diode (LED) structure that can be used to reduce current crowding effects in an LED. It is understood that additional layers can also be formed into a pattern. For example, textured nitride layer 16 and second layer 18 shown in FIG. 2 both could be formed into the set of stripes 24A–D, with second layer 18 formed above textured nitride layer 16 on each stripe 24A–D. Alternatively, FIG. 6 shows a top view of semiconductor structure 10 in which textured nitride layer 16 has been formed into a circle pattern that comprises a set of circles 26A–D. Set of circles 26A–D can be used, for example, in fabricating an array of LEDs or laser diodes. It is understood that the embodiments shown are only illustrative of the various patterns that can be formed, numerous alternative patterns can be formed under the invention.

Figure 7:
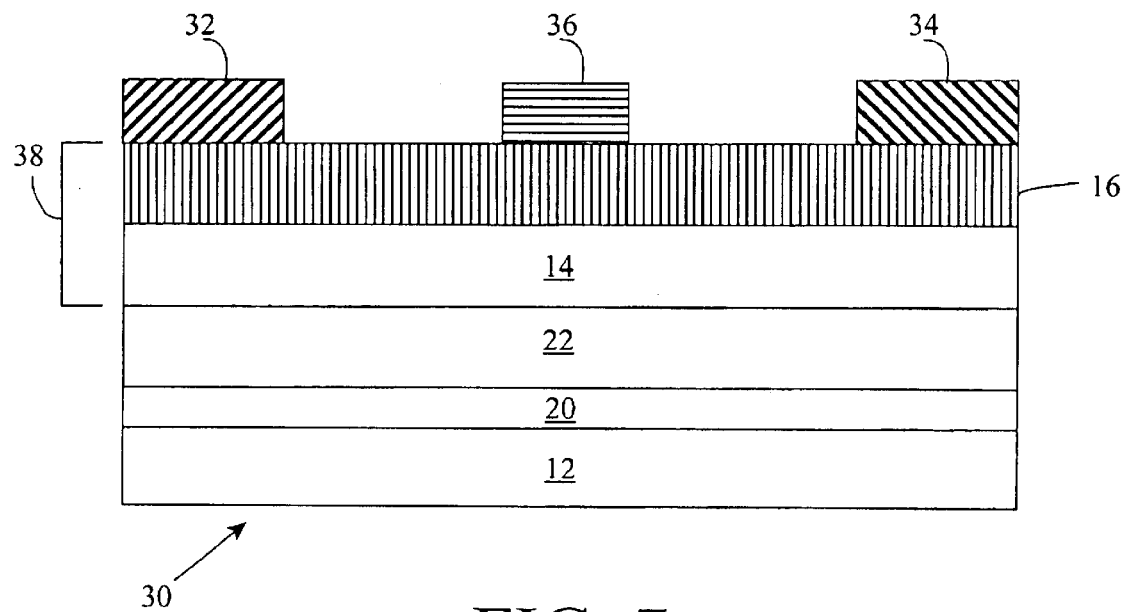
FIG. 7 shows an illustrative field effect transistor according to one embodiment of the invention.

Semiconductor structure 10 can be configured to operate as any type of semiconductor device. For example, FIG. 7 shows a semiconductor structure configured to operate as a field effect transistor (FET) 30. To this extent, field effect transistor 30 is shown including a substrate 12, buffer layer 20, and active layer 22 as discussed above with reference to FIG. 3. Further, field effect transistor 30 includes a source contact 32, drain contact 34, and gate contact 36 formed above textured nitride layer 16. In this configuration, first layer 14 and textured nitride layer 16 form a gate barrier structure 38 between active layer 22 and contacts 32, 34, 36. First layer 14 can comprise, for example, a crystalline nitride layer. It is understood that source contact 32, drain contact 34, and gate contact 36 can be located on field effect transistor 30 in any manner. For example, gate contact 36 can be located closer to source contact 32 than drain contact 34.

Figure 8:
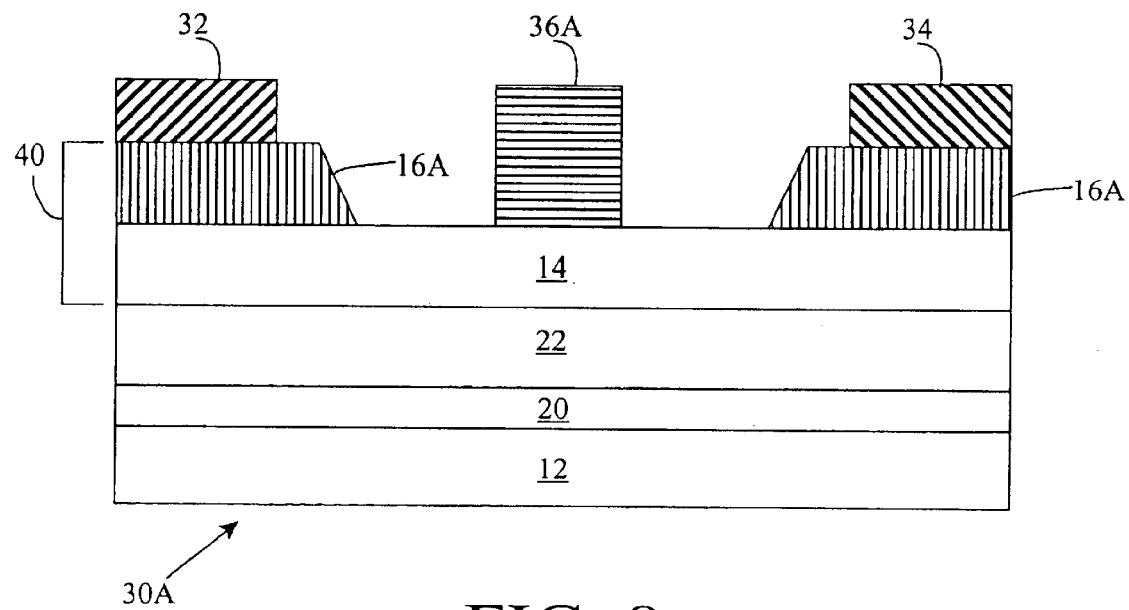
FIG. 8 shows an illustrative field effect transistor according to another embodiment of the invention.
Figure 9:
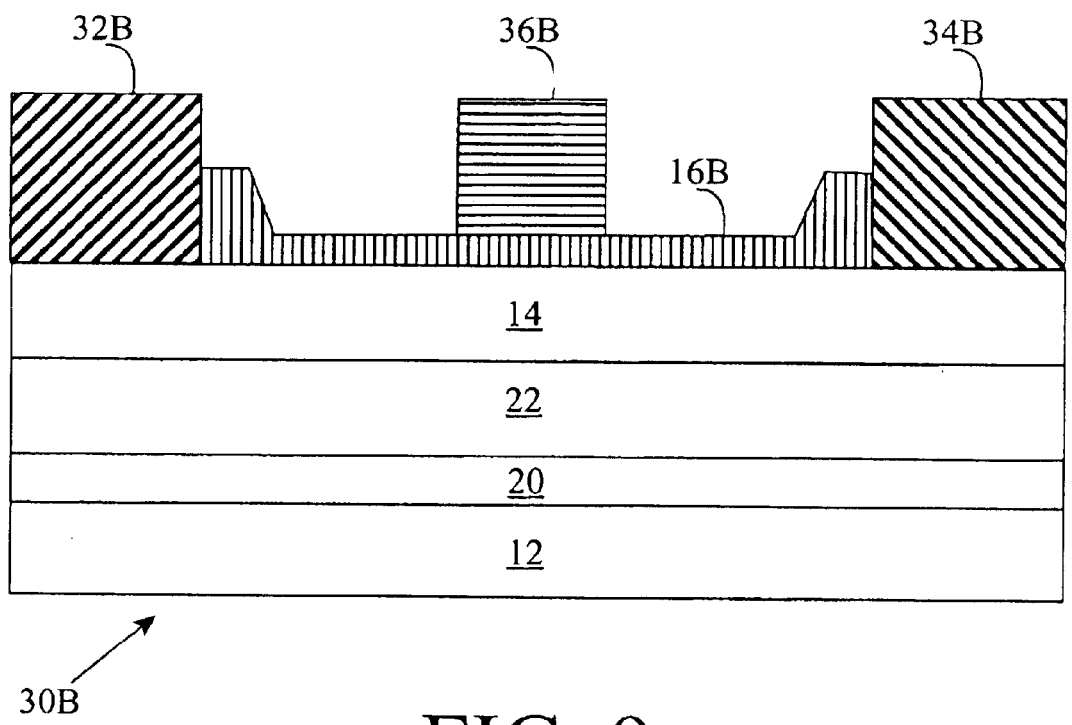
FIG. 9 shows an illustrative field effect transistor according to still another embodiment of the invention.

Various alternative configurations for field effect transistor 30 are possible. For example, FIG. 8 shows a field effect transistor 30A in which textured nitride layer 16A only covers a portion of first layer 14 to form a gate barrier structure 40. In this configuration, gate contact 36A is formed on first layer 14, and source contact 32 and gate contact 34 are formed on textured nitride layer 16A. Alternatively, FIG. 9 shows a field effect transistor 30B in which source contact 32B and drain contact 34B are formed on first layer 14, while gate contact 36B is formed on textured nitride layer 16B. As shown, textured nitride layer 16B is adjacent to and contacts both source contact 32B and drain contact 34B, and has a narrower width below gate contact 36B to form a recessed gate structure. It is understood that various additional alternatives to the embodiments shown are also possible. For example, all three contacts 32, 34, 36 could be formed on first layer 14 with textured nitride layer 16 being formed adjacent each contact. Further, all three contacts 32, 34, 36 could be formed on textured nitride layer 16, and textured nitride layer 16 can form a recessed gate structure under gate contact 36B.

Figure 10:
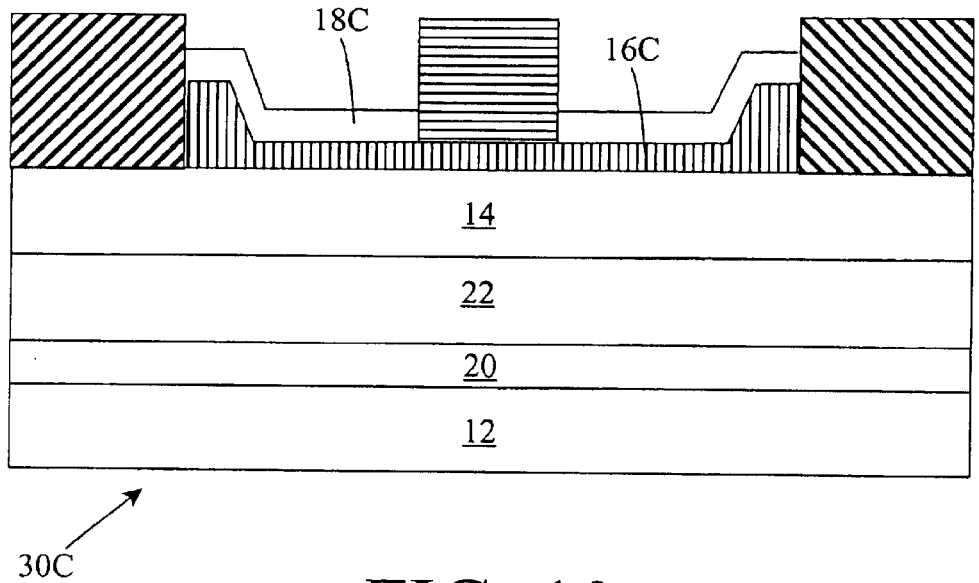
FIG. 10 shows an illustrative field effect transistor according to yet another embodiment of the invention.
Figure 11:
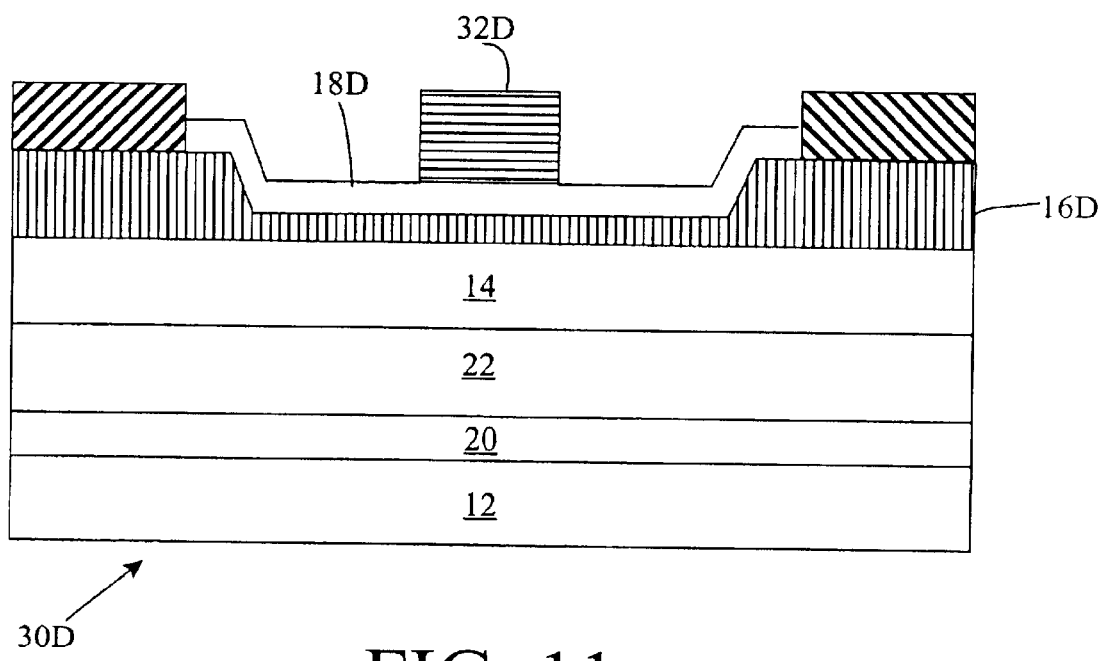
FIG. 11 shows an illustrative field effect transistor according to yet another embodiment of the invention.

Additionally, field effect transistor 30 can include one or more additional layers. For example, FIG. 10 shows a field effect transistor 30C similar to field effect transistor 30B shown and discussed in FIG. 9, except that field effect transistor 30C includes a passivating layer 18C. Passivating layer 18C can comprise, for example, a dielectric layer comprised of silicon dioxide, silicon nitride, or the like. Alternatively, FIG. 11 shows a field effect transistor 30D in which passivating layer 18D is formed between textured nitride layer 16D and gate contact 32D, thereby forming a dielectric barrier between textured nitride layer 16D and gate contact 32D.

Figure 12:
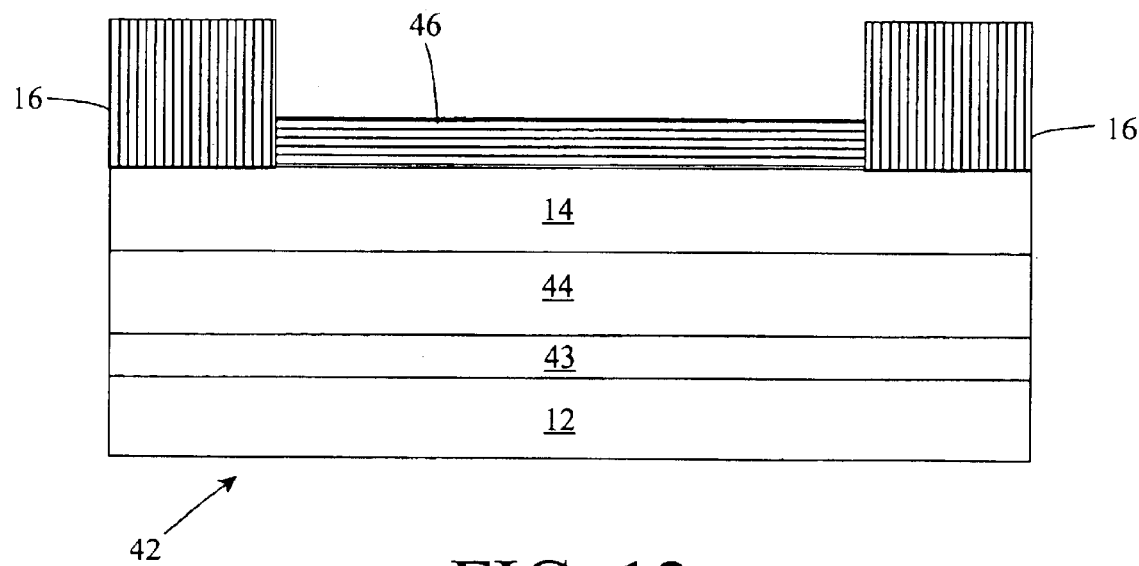
FIG. 12 shows an illustrative light emitting device according to one embodiment of the invention.
Figure 13:
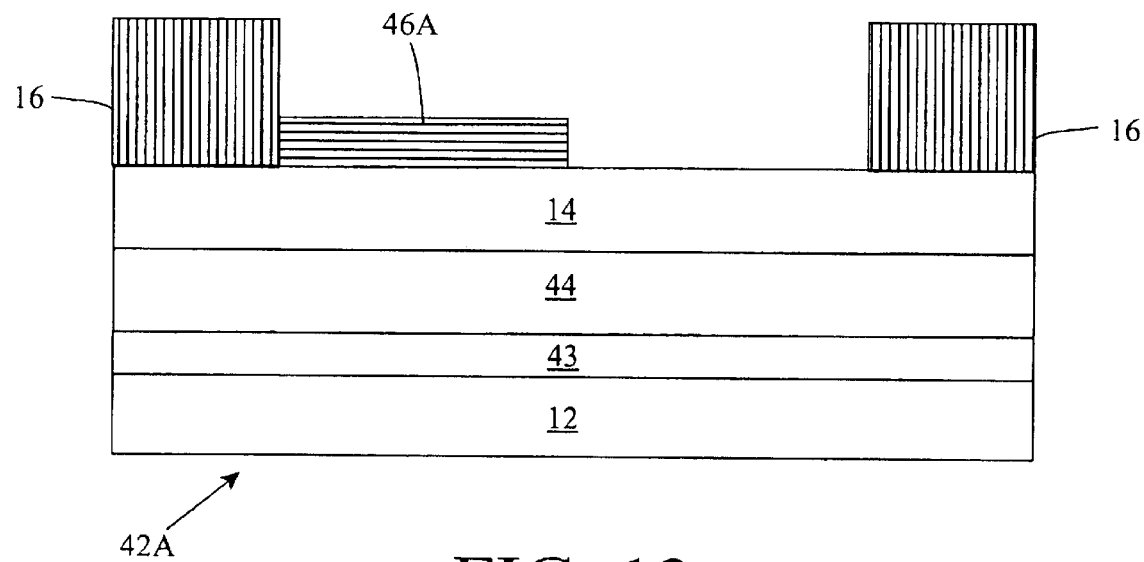
FIG. 13 shows an illustrative light emitting device according to another embodiment of the invention.

The semiconductor structure can also be configured to operate as a light emitting device. For example, FIG. 12 shows a light emitting device 42 that includes a substrate 12, a first layer 14, and a textured nitride layer 16. Light emitting device 42 also includes a first structure 43, a light emitting (active) structure 44, and a contact 46. As shown, textured nitride layer 16 is formed above a portion or a section of first layer 14, and contact 46 is formed above the remainder of first layer 14, adjacent to textured nitride layer 16. In an alternative embodiment shown in FIG. 13, contact 46A is formed above only a portion of first layer 14 that is not covered by textured nitride layer 16, and is adjacent to only a portion of textured nitride layer 16. In either case, first structure 43 can comprise one or more n-type layers, and first layer 14 and/or contact 46 can comprise p-type layers. Light emitting structure 44 can comprise one or more layers configured to generate light when light emitting device 42 is in operation. For example, light emitting structure 44 can comprise one or more layers that emit light of a desired frequency (e.g., in a light emitting diode), or light of a particular frequency that is also aligned in a particular manner (e.g., in a laser).

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor structure, comprising:
   a substrate;
   a buffer layer formed on the substrate;
   a first layer formed above the substrate; and
   a textured nitride layer formed on the first layer.

2. The structure of claim 1, further comprising at least one of: a dielectric layer and a metal layer formed above the textured nitride layer.

3. The structure of claim 1, further comprising at least one of: a GaN layer and an AlInGaN layer formed between the buffer layer and the first layer.

4. The structure of claim 1, further comprising a light emitting structure formed between the buffer layer and the first layer.

5. The structure of claim 1, wherein the structure is used as a semiconductor device comprising at least one of: a field effect transistor, a light emitting diode, and a laser.

6. The structure of claim 1, wherein the first layer comprises a crystalline nitride layer.

7. The structure of claim 1, wherein the textured nitride layer partially covers the first layer.

8. The structure of claim 7, wherein the textured nitride layer forms at least one of: a stripe pattern and a circle pattern.

9. The structure of claim 1, wherein the first layer and the textured nitride layer comprise a gate barrier structure.

10. The structure of claim 9, further comprising at least one contact formed on the gate barrier structure.

11. A field effect transistor comprising:
    a substrate;
    an active layer formed above the substrate;
    a crystalline nitride layer formed above the active layer; and
    a textured nitride layer formed on the crystalline nitride layer.

12. The field effect transistor of claim 11, wherein the crystalline nitride layer and the textured nitride layer comprise a gate barrier structure.

13. The field effect transistor of claim 12, further comprising at least one of: a source contact, a drain contact, and a gate contact formed above the textured nitride layer.

14. The field effect transistor of claim 11, further comprising at least one of: a source contact, a drain contact, and a gate contact formed beside the textured nitride layer.

15. The field effect transistor of claim 11, wherein the nitride layer forms a layered recessed gate structure for at least one of: a source contact, a drain contact, and a gate contact.

16. The field effect transistor of claim 11, further comprising a passivating layer formed above the textured nitride layer.

17. A light emitting device, comprising:
    a substrate;
    an n-type layer formed above the substrate;
    a light emitting structure formed above the n-type layer;
    a p-type crystalline nitride layer formed above the light emitting structure; and
    a textured nitride layer formed on the crystalline nitride layer.

18. The device of claim 17, further comprising a p-type contact formed above the textured nitride layer.

19. The device of claim 17, wherein the device comprises at least one of: a light emitting diode and a laser.

* * * * *

UNITED STATES PATENT AND TRADEMARK OFFICE
CERTIFICATE OF CORRECTION

PATENT NO. : 6,903,385 B2
DATED : June 7, 2005
INVENTOR(S) : Gaska et al.

It is certified that error appears in the above-identified patent and that said Letters Patent is hereby corrected as shown below:

Column 5,
Line 55, please insert -- buffer layer -- in place of the word "substrate".

Signed and Sealed this

Twenty-third Day of August, 2005

JON W. DUDAS
*Director of the United States Patent and Trademark Office*